(12) United States Patent
Cho

(10) Patent No.: US 8,614,503 B2
(45) Date of Patent: Dec. 24, 2013

(54) COMMON DRAIN EXPOSED CONDUCTIVE CLIP FOR HIGH POWER SEMICONDUCTOR PACKAGES

(75) Inventor: Eung San Cho, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 39 days.

(21) Appl. No.: 13/111,904

(22) Filed: May 19, 2011

(65) Prior Publication Data

US 2012/0292754 A1    Nov. 22, 2012

(51) Int. Cl.
*H01L 23/02* (2006.01)

(52) U.S. Cl.
USPC ........................................................ 257/678

(58) Field of Classification Search
CPC .......... H01L 2924/01079; H01L 2224/48091; H01L 2924/01078
USPC .......... 257/676, 678, 701, 684, 698, 723, 724
See application file for complete search history.

(56) References Cited

U.S. PATENT DOCUMENTS

| 6,946,740 | B2 | 9/2005 | Schaffer | |
|---|---|---|---|---|
| 2003/0098468 | A1* | 5/2003 | Wheeler et al. | 257/200 |
| 2004/0063240 | A1* | 4/2004 | Madrid et al. | 438/106 |
| 2004/0090567 | A1* | 5/2004 | Lee et al. | 349/58 |
| 2007/0187807 | A1* | 8/2007 | Lee et al. | 257/676 |
| 2007/0290337 | A1* | 12/2007 | Otremba et al. | 257/737 |
| 2008/0007920 | A1* | 1/2008 | Shiraki et al. | 361/717 |
| 2009/0294936 | A1* | 12/2009 | Liu et al. | 257/675 |

* cited by examiner

*Primary Examiner* — Nikolay Yushin
(74) *Attorney, Agent, or Firm* — Farjami & Farjami LLP

(57) ABSTRACT

One exemplary disclosed embodiment comprises a semiconductor package including multiple transistors having a common drain coupled to an exposed conductive clip. A driver integrated circuit (IC) may control the transistors for various power applications. By exposing a top surface of the exposed conductive clip outside of a mold compound of the package, enhanced thermal performance is provided. Additionally, the conductive clip provides a short distance, high current carrying route between transistors of the package, providing higher electrical performance and reduced form factor compared to conventional designs with individually packaged transistors.

20 Claims, 3 Drawing Sheets

COMMON DRAIN EXPOSED CONDUCTIVE CLIP FOR HIGH POWER SEMICONDUCTOR PACKAGES

BACKGROUND OF THE INVENTION

1. Field of the Invention

The present invention relates generally to semiconductor devices. More particularly, the present invention relates to packaging of semiconductor devices.

2. Background Art

Optimization of electrical and thermal performance is an important consideration for high frequency, high voltage power applications. It is known to use a conductive clip to provide a high performance interconnect between a transistor and input/output terminals within a package. Additionally, by exposing the conductive clip to the outside of the package, enhanced thermal dissipation may be provided, for example by affixing a heat sink to the exposed area of the conductive clip.

Multiple transistors are often required in high-power circuit applications; for example, high power transistors connected in parallel by a common drain. Additionally, a driver integrated circuit (IC) (or a "gate driver") is necessary to drive and control the transistors.

Conventionally, the driver IC and the transistors may be individually packaged and disposed on a shared support surface, such as a printed circuit board (PCB). However, the routing of current lines through the PCB negatively affects electrical performance, and the form factor of the individual packages requires significant area to be reserved on the PCB, adding cost and complexity.

Thus, a unique and cost-effective solution is needed to support the efficient design and operation of high power circuit applications while providing enhanced thermal dissipation and a compact form factor.

SUMMARY OF THE INVENTION

A common drain exposed conductive clip for high power semiconductor packages, substantially as shown in and/or described in connection with at least one of the figures, and as set forth more completely in the claims.

DETAILED DESCRIPTION OF THE INVENTION

The present application is directed to a common drain exposed conductive clip for high power semiconductor packages. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1A:
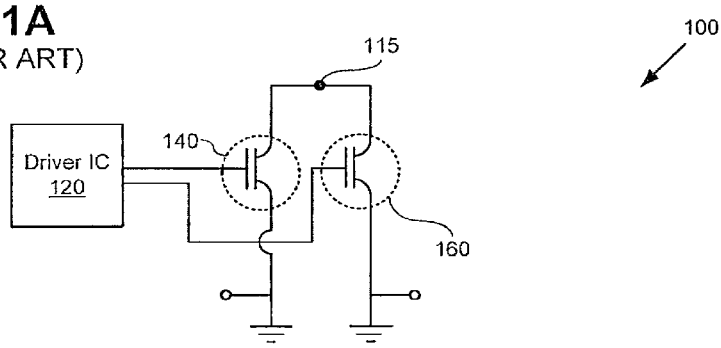
FIG. 1A illustrates a circuit diagram with transistors in a common drain configuration.

FIG. 1A illustrates a circuit diagram with transistors in a common drain configuration. Diagram 100 includes switched node 115, driver integrated circuit (IC) 120, first transistor 140, and second transistor 160. The drain of first transistor 140 is coupled and shared with the drain of second transistor 160 at node 115. The source of first transistor 140 and the source of second transistor 160 are independently grounded, however in alternative embodiments the transistors may share a common ground. Driver IC 120 controls the duty cycles of first transistor 140 and second transistor 160. First transistor 140 and second transistor 160 may each comprise a conventional field effect transistor (FET) switch, for example a silicon FET. However, first transistor 140 and second transistor 160 may each also comprise a non-silicon FET or any other FET in general. Alternatively, one or both of first transistor 140 and second transistor 160 may also comprise a III-nitride transistor. To implement the circuit of diagram 100 in FIG. 1A, it is known to package driver IC 120, first transistor 140, and second transistor 160 into separate packages and connect them on a support surface such as a printed circuit board (PCB).

Figure 1B:
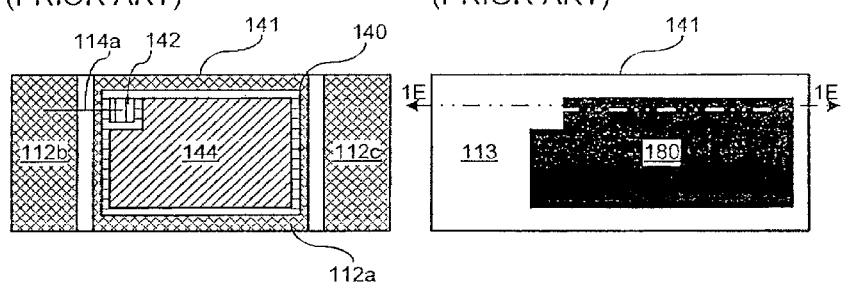
FIG. 1B illustrates a top view of a conventional semiconductor package.

Turning to FIG. 1B, FIG. 1B illustrates a top view of a conventional semiconductor package. FIG. 1B includes package 141, which may comprise, for example, a quad flat no-leads (QFN) package. Package 141 includes pads 112a, 112b, and 112c, wirebond 114a, and first transistor 140. Pads 112a, 112b, and 112c may comprise pads of a substrate, such as, but not limited to, a printed circuit board (PCB), a ceramic substrate, direct bonded copper (DBC), or a leadframe. First transistor 140, which may correspond to first transistor 140 from FIG. 1A, is disposed on pad 112a and includes a top surface having a first gate 142 and a first source 144 and a bottom surface (not shown) having a first drain 146. First gate 142 is coupled to pad 112b through wirebond 114a. A similar package 161 (not shown) may also be fabricated by substituting second transistor 160 for first transistor 140.

Figure 1D:
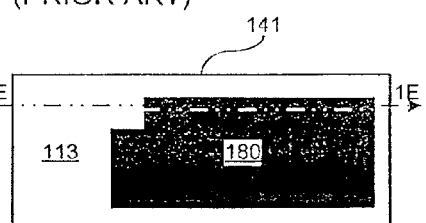
FIG. 1D illustrates a top view of a conventional semiconductor package with an exposed conductive clip.
Figure 1C:
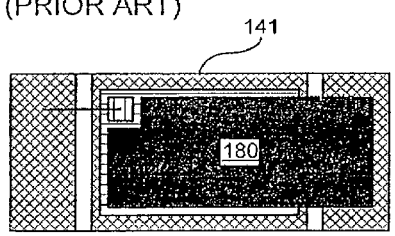
FIG. 1C illustrates a top view of a conventional semiconductor package with a conductive clip.

Moving to FIG. 1C, FIG. 1C illustrates a top view of a conventional semiconductor package with a conductive clip. FIG. 1C includes package 141. Comparing FIG. 1C with FIG. 1B, FIG. 1C adds a conductive clip 180 to package 141 of FIG. 1B. Conductive clip 180 is coupled to pad 112c and first source 144.

Turning to FIG. 1D, FIG. 1D illustrates a top view of a conventional semiconductor package with an exposed conductive clip. FIG. 1D includes package 141. Comparing FIG. 1D with FIG. 1C, FIG. 1D adds an encapsulating mold compound 113 to package 141 of FIG. 1C. As shown in FIG. 1D, the mold compound 113 is formed such that a top surface of conductive clip 180 is exposed, thereby resulting in an exposed conductive clip 180. For example, the top surface of package 141 may be abutted against an inner wall of a top pocket of a mold used to shape mold compound 113. Exposed conductive clip 180 may provide enhanced thermal dissipation by radiating heat directly to ambient air or to an attached heat sink. The thermal performance of package 141 may comprise an important long-term reliability consideration, particularly for high power applications.

Figure 1E:
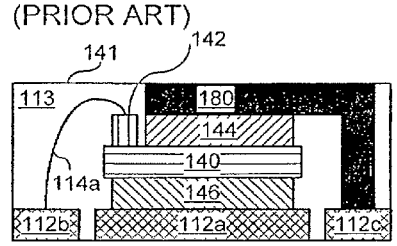
FIG. 1E illustrates a cross sectional view of a conventional semiconductor package with an exposed conductive clip.

Regarding FIG. 1E, FIG. 1E illustrates a cross sectional view of a conventional semiconductor package with an exposed conductive clip. The cross section shown in FIG. 1E may correspond to the cross sectional line indicated by line 1E-1E of FIG. 1D. FIG. 1E includes package 141, which includes pads 112a, 112b, and 112c, first transistor 140 disposed on pad 112a and having a bottom surface including a first drain 146 and a top surface including a first gate 142 and a first source 144, a wirebond 114a coupling first gate 142 to pad 112b, and an exposed conductive clip 180 coupled to first source 144 and pad 112c.

Figure 1F:
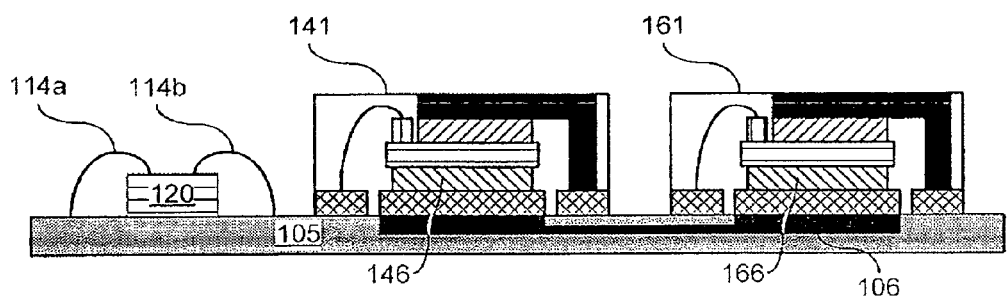
FIG. 1F illustrates a cross sectional view of transistors in a common drain configuration conventionally packaged and mounted on a printed circuit board.

Addressing FIG. 1F, FIG. 1F illustrates a cross sectional view of transistors in a common drain configuration conventionally packaged and mounted on a printed circuit board. FIG. 1F includes a substrate 105, which may comprise a printed circuit board (PCB). Driver IC 120, package 141, and package 161 are disposed on substrate 105. Package 141 may correspond to package 141 as illustrated in FIG. 1D and FIG. 1E. Package 161 may also have a similar composition, substituting second transistor 160 for first transistor 140. Wirebonds 114a and 114b may connect to pads on substrate 105 and further routed to respective gate terminals of packages 141 and 161. Trace 106 in substrate 105 may connect a first drain 146 of package 141 to a second drain 166 of package 161. Thus, FIG. 1F may implement the circuit in diagram 100 of FIG. 1A.

However, a significant portion of substrate 105 must be reserved to implement the circuit in diagram 100 of FIG. 1A. More specifically, lateral space must be reserved for driver IC, package 141, package 161, vertical space must be reserved for wirebonds 114a and 114b, and various interconnects must be provided within substrate 105, such as trace 106. As a result, implementing the circuit of FIG. 1A using the conventional design of FIG. 1F undesirably increases form factor, complexity, and cost.

Figure 2A:
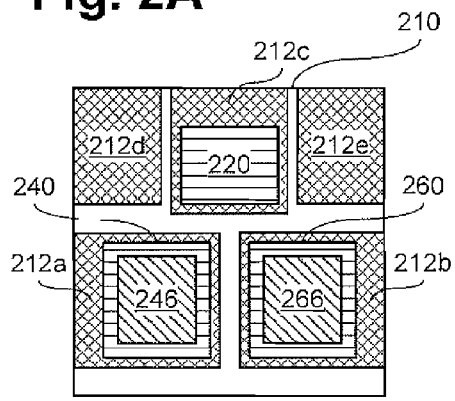
FIG. 2A illustrates a top view of a high power semiconductor package according to an embodiment of the invention.

FIG. 2A illustrates a top view of a high power semiconductor package according to an embodiment of the invention. FIG. 2A includes package 210, which may comprise a QFN or another leadless package and includes driver IC 220 disposed on pad 212c, first transistor 240 disposed on pad 212a, and second transistor 260 disposed on pad 212b. Pads 212d and 212e are not connected in FIG. 2A. Pads 212a through 212e may comprise pads of a substrate, such as, but not limited to, a printed circuit board (PCB), a ceramic substrate, direct bonded copper (DBC), or a leadframe. As shown in FIG. 2A, first transistor 240 is oriented such that a first drain 246 is disposed on a top surface thereof, with a first gate 242 (not shown) and a first source 244 (not shown) disposed on a bottom surface thereof. Second transistor 260 is similarly oriented such that a second drain 266 disposed on a top surface thereof, with a second gate 262 (not shown) and a second source 264 (not shown) disposed on a bottom surface thereof. Driver IC 220 may comprise a flip chip, enabling package 210 to have no wirebonds. However, driver IC 220 may also comprise a wirebonded IC.

While pads 212a through 212e are shown as continuous rectangular shaped pads for simplicity, it is understood that each of pads 212a through 212e may each comprise multiple distinct pads for appropriate signal routing. For example, pad 212c may comprise several individual pads to accommodate input and output terminals of driver IC 220. Pad 212a may be separated into one set of pads for first gate 242 and another set of pads for first source 244. Similarly, pad 212b may be separated into one set of pads for second gate 262 and another set of pads for second source 264. Pads 212b and 212e may also be divided into separate pad sections. Additional routing, not shown in FIG. 2A, may be provided to link portions of the pads, for example to couple driver IC 220 to first gate 242 and second gate 262. To provide such routing, the shapes of pads 212a through 212e may be extended as necessary, wirebonds may be attached to the appropriate pads, or traces may be provided in a corresponding substrate or support surface such as a PCB. Additionally, it is noted that in various embodiments of the present invention, one or both of first transistor 240 and second transistor 260 can be depletion mode transistors, for example, III-nitride depletion mode transistors. Furthermore, while two transistors are utilized in package 210 of FIG. 2A, alternative embodiments may utilize more than two transistors.

Figure 2D:
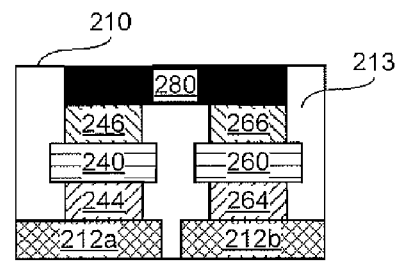
FIG. 2D illustrates a cross sectional view of a high power semiconductor package according to an embodiment of the invention.
Figure 2B:
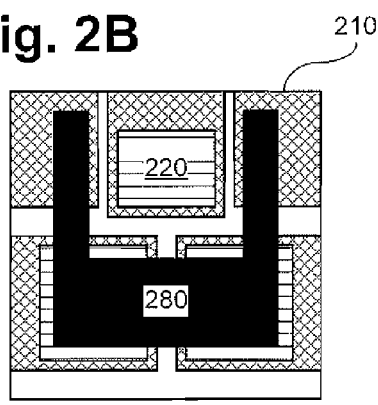
FIG. 2B illustrates a top view of a high power semiconductor package with a common drain conductive clip according to an embodiment of the invention.

Turning to FIG. 2B, FIG. 2B illustrates a top view of a high power semiconductor package with a common drain conductive clip according to an embodiment of the invention. Comparing FIG. 2B with FIG. 2A, FIG. 2B adds a conductive clip 280 to package 210 of FIG. 2A. Conductive clip 280 may comprise any highly conductive material, including a metal such as copper or a metallic alloy, and is coupled to first drain 246 and second drain 266, for example by solder, conductive adhesive, or another attach material. Accordingly, conductive clip 280 electrically couples first drain 246 to second drain 266, corresponding to node 115 in FIG. 1A. Additionally, conductive clip 280 may be attached to pad 212d and/or pad 212e. Thus, the layout of package 210 in FIG. 2B connects driver IC 220, first transistor 240, and second transistor 260 as shown in diagram 100 of FIG. 1A.

Figure 2E:
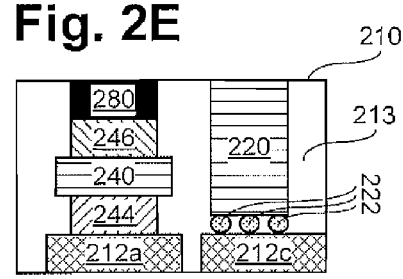
FIG. 2E illustrates a cross sectional view of a high power semiconductor package according to an embodiment of the invention.
Figure 2C:
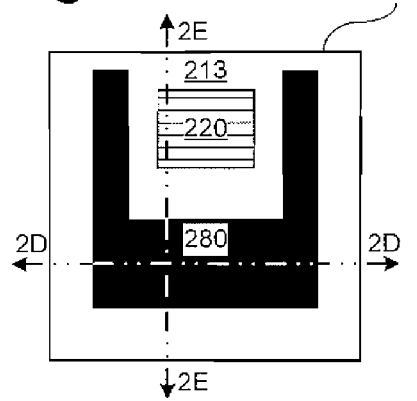
FIG. 2C illustrates a top view of a high power semiconductor package with a common drain exposed conductive clip according to an embodiment of the invention.

With respect to FIG. 2C, FIG. 2C illustrates a top view of a high power semiconductor package with a common drain exposed conductive clip according to an embodiment of the invention. Comparing FIG. 2C with FIG. 2B, a mold compound 213 is formed over first transistor 240 and second transistor 260 without covering a top surface of conductive clip 280 from FIG. 2B so as to form an exposed conductive clip 280 in FIG. 2C. For example, the top surface of package 210 may be abutted against an inner wall of a top pocket of a mold used to shape mold compound 213. Additionally, mold compound 213 may be formed without covering a top surface of driver IC 220, as illustrated in FIG. 2C, thereby providing enhanced thermal dissipation for driver IC 220. However, in alternative embodiments, mold compound 213 may encapsulate driver IC 220.

Conductive clip 280 may also comprise a plurality of stacked clips rather than a single clip, allowing package 210 to extend higher while still exposing conductive clip 280, for example to provide sufficient clearance for any wirebonds that may be utilized in package 210. Optionally, a heat sink may be affixed to an exposed portion of exposed conductive clip 280 and/or driver IC 220.

Moving to FIG. 2D, FIG. 2D illustrates a cross sectional view of a high power semiconductor package according to an embodiment of the invention. The cross section shown in FIG. 2D may correspond to the cross sectional line indicated by line 2D-2D of FIG. 2C. As shown in FIG. 2D, package 210 includes pad 212a and 212b. A bottom surface of first transistor 240 includes a first source 244 disposed on pad 212a. A top surface of first transistor 240 includes first drain 246, which is coupled to exposed conductive clip 280. A bottom surface of second transistor 260 includes a second source 264 disposed on pad 212h. A top surface of second transistor 260 includes second drain 266, which is coupled to exposed conductive clip 280. Accordingly, conductive clip 280 provides a shared drain connection, coupling first drain 246 to second drain 266. Package 210 is encapsulated within mold compound 213, which does not cover the top surface of exposed conductive clip 280.

Discussing FIG. 2E, FIG. 2E illustrates a cross sectional view of a high power semiconductor package according to an embodiment of the invention. The cross section shown in FIG. 2E may correspond to the cross sectional line indicated by line 2E-2E of FIG. 2C. As shown in FIG. 2E, package 210 includes pads 212a and 212c. A bottom surface of first transistor 240 includes first source 244 disposed on pad 212a. A top surface of first transistor 240 includes first drain 246, which is coupled to exposed conductive clip 280. Driver IC 220, comprising a flip chip, is attached to pad 212c through solder balls 222. As previously discussed, while pad 212c is shown as a continuous pad for simplicity, pad 212c may actually comprise several independent pads for the routing of signals to driver IC 220. For example, one portion of pad 212c may be connected to a gate portion of pad 212a, and another portion of pad 212c may be connected to a gate portion of pad 212b. As shown in FIG. 2E, mold compound 213 still exposes the top surface of conductive clip 280 outside of package 210.

Figure 2F:
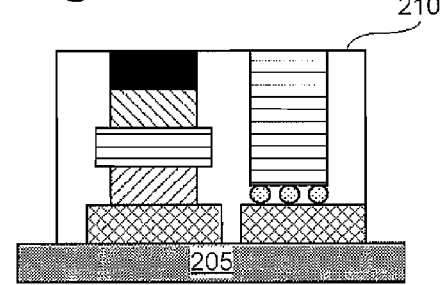
FIG. 2F illustrates a cross sectional view of transistors in a common drain configuration mounted on a printed circuit board according to an embodiment of the invention.

Thus, exposed conductive clip 280 electrically and mechanically couples first drain 246 and second drain 266 through a low resistance, short distance path while also being exposed to the outside of package 210, providing an efficient current path between second transistor 260 and first transistor 240 while providing enhanced thermal performance and reduced package form factor. The above advantages provided by package 210 are further emphasized in FIG. 2F, which illustrates a cross sectional view of transistors in a common drain configuration mounted on a printed circuit board according to an embodiment of the invention. Since package 210 as illustrated in FIGS. 2C, 2D, and 2E already implement the circuit of diagram 100 in FIG. 1A, no additional components are required. Thus, package 210 is simply mounted to support surface 205, such as printed circuit board. The reduced package form factor provided by package 210 is especially evident when comparing to the conventional design shown in FIG. 1F, where driver IC 120, package 141, and package 161 are separately mounted to substrate 105. The efficient design of exposed conductive clip 280, where multiple transistors are coupled together in a common drain configuration and thermally exposed in a single package, provides package 210 with enhanced thermal and electrical performance suitable for high power applications.

Thus, a common drain exposed conductive clip for a high power semiconductor package has been described. According to the present invention, by using an exposed conductive clip 280 that is coupled to multiple transistors to provide a common drain connection, a thermally and electrically enhanced semiconductor package may be provided for various high power applications while optimizing package form factor compared to conventional packages.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A high power semiconductor package comprising:
at least two transistors, each of said at least two transistors including a respective top surface having a respective drain electrode and a respective bottom surface disposed on at least one pad;
a driver integrated circuit (IC) driving said at least two transistors;
an exposed conductive clip coupled to said respective drain electrode of each of said at least two transistors and coupling said respective drain electrode of each of said at least two transistors to another pad;
a mold compound enclosing said at least two transistors without covering a top surface of said exposed conductive clip.

2. The high power semiconductor package of claim 1, wherein said driver IC is a flip chip.

3. The high power semiconductor package of claim 2, wherein said mold compound encloses said driver IC without covering a top surface of said driver IC.

4. The high power semiconductor package of claim 2, wherein said package does not include a wirebond.

5. The high power semiconductor package of claim 1, wherein said exposed conductive clip is coupled using solder.

6. The high power semiconductor package of claim 1, wherein said another pad is a leadframe pad.

7. The high power semiconductor package of claim 1, wherein said exposed conductive clip comprises a copper clip.

8. The high power semiconductor package of claim 1, wherein said exposed conductive clip comprises a plurality of stacked clips.

9. The high power semiconductor package of claim 1, wherein said package is a leadless package.

10. The high power semiconductor package of claim 1, wherein said at least two transistors include a III-nitride depletion mode transistor.

11. A high power semiconductor package comprising:
a first transistor including a top surface having a first drain and a bottom surface having a first gate;
a second transistor including a top surface having a second drain and a bottom surface having a second gate;
said bottom surface of said first transistor and said bottom surface of said second transistor disposed on at least one pad;
a driver integrated circuit (IC) coupled to said first gate and said second gate;
an exposed conductive clip coupled to said first drain and said second drain;

said exposed conductive clip coupling said first drain and said second drain to another pad;

a mold compound enclosing said first transistor and said second transistor without covering a top surface of said exposed conductive clip.

12. The high power semiconductor package of claim 11, wherein said driver IC is a flip chip.

13. The high power semiconductor package of claim 12, wherein said mold compound encloses said driver IC without covering a top surface of said driver IC.

14. The high power semiconductor package of claim 12, wherein said package does not include a wirebond.

15. The high power semiconductor package of claim 11, wherein said exposed conductive clip is coupled using solder.

16. The high power semiconductor package of claim 11, wherein said another pad is a leadframe pad.

17. The high power semiconductor package of claim 11, wherein said exposed conductive clip comprises a copper clip.

18. The high power semiconductor package of claim 11, wherein said exposed conductive clip comprises a plurality of stacked clips.

19. The high power semiconductor package of claim 11, wherein said package is a leadless package.

20. The high power semiconductor package of claim 11, wherein each of said first transistor and said second transistor comprises a Ill-nitride depletion mode transistor.

* * * * *